(12) United States Patent
Hashimoto et al.

(10) Patent No.: US 8,746,631 B2
(45) Date of Patent: Jun. 10, 2014

(54) ARTICLE CARRIER ROBOT

(75) Inventors: Yasuhiko Hashimoto, Kobe (JP);
Toshiaki Yoshida, Kobe (JP); Tetsuya Yoshida, Kakogawa (JP)

(73) Assignee: Kawasaki Jukogyo Kabushiki Kaisha, Kobe-Shi (JP)

( * ) Notice: Subject to any disclaimer, the term of this patent is extended or adjusted under 35 U.S.C. 154(b) by 793 days.

(21) Appl. No.: 12/990,731

(22) PCT Filed: Apr. 27, 2009

(86) PCT No.: PCT/JP2009/058294
§ 371 (c)(1),
(2), (4) Date: Nov. 2, 2010

(87) PCT Pub. No.: WO2009/136567
PCT Pub. Date: Nov. 12, 2009

(65) Prior Publication Data
US 2011/0054683 A1    Mar. 3, 2011

(30) Foreign Application Priority Data

May 9, 2008    (JP) .................................. 2008-124059

(51) Int. Cl.
*H02G 11/00*    (2006.01)

(52) U.S. Cl.
USPC .............. 248/49; 248/51; 248/52; 74/490.02; 59/78.1

(58) Field of Classification Search
CPC .............. B25J 5/00; B25J 5/02; B25J 9/0027; B25J 9/04; B25J 9/041; B25J 9/042; B25J 9/043; B25J 9/06; B25J 9/108; B25J 11/0095; B25J 19/0025; B25J 19/0029; B25J 19/0041; B25J 19/0075; H01L 21/67742; H02G 11/00; H02G 11/003

USPC .............. 74/490.02, 490.07, 490.08, 490.09; 414/630, 631, 744.3; 901/15; 248/49, 248/51, 52, 56, 67, 68.1; 59/78.1
See application file for complete search history.

(56) References Cited

U.S. PATENT DOCUMENTS 5,831,217 A * 11/1998 Jarvis et al. ............... 174/153 R
6,578,800 B2 * 6/2003 Stefan ............................. 248/52
(Continued)

FOREIGN PATENT DOCUMENTS

JP    A-61-236481    10/1986
JP    U-63-21582    2/1988
(Continued)

OTHER PUBLICATIONS

International Preliminary Report on Patentability in International Application No. PCT/JP2009/058294; dated Dec. 13, 2010.
(Continued)

*Primary Examiner* — Saul Rodriguez
*Assistant Examiner* — Brendan Tighe
(74) *Attorney, Agent, or Firm* — Oliff PLC

(57) ABSTRACT

An article carrier robot includes: a horizontal base; a horizontally movable unit supported by the horizontal base so as to be movable in a horizontal direction; a robot main body supported by the horizontally movable unit; at least one of wiring and piping introduced into the robot main body from the horizontal base; and a restriction unit supported by the horizontally movable unit so as to be swayable about a pivot provided to the horizontally movable unit. The restriction unit is configured to restrict deformation of a part of the at least one of wiring and piping.

18 Claims, 8 Drawing Sheets

(56) References Cited

U.S. PATENT DOCUMENTS

| | | | |
|---|---|---|---|
| 7,278,253 B2* | 10/2007 | Wehler et al. | 59/78.1 |
| 7,504,579 B2* | 3/2009 | Frank | 174/36 |
| 7,964,213 B2* | 6/2011 | Hori et al. | 424/449 |
| 8,237,781 B2* | 8/2012 | Yamauchi et al. | 348/61 |
| 2001/0052564 A1* | 12/2001 | Karlinger | 248/74.1 |
| 2002/0007844 A1 | 1/2002 | Orii et al. | |
| 2007/0084626 A1* | 4/2007 | Frank | 174/135 |
| 2008/0271429 A1* | 11/2008 | Komiya | 59/78.1 |
| 2011/0111622 A1* | 5/2011 | Koyama et al. | 439/577 |

FOREIGN PATENT DOCUMENTS

| | | |
|---|---|---|
| JP | U-63-131388 | 8/1988 |
| JP | U-2-74195 | 6/1990 |
| JP | A-3-208591 | 9/1991 |
| JP | A-3-251385 | 11/1991 |
| JP | A-07-052078 | 2/1995 |
| JP | A-10-249759 | 9/1998 |
| JP | A-11-277481 | 10/1999 |
| JP | A-2001-310287 | 11/2001 |
| JP | A-2002-110612 | 4/2002 |
| JP | A-2003-037153 | 2/2003 |
| JP | A-2006-158197 | 6/2006 |
| JP | A-2007-168461 | 7/2007 |

OTHER PUBLICATIONS

Sep. 23, 2011 Search Report issued in European Application No. 09742691.0.

International Search Report in International Application No. PCT/JP2009/058294; dated Jul. 14, 2009 (with English-language translation).

Japanese Office Action issued in Japanese Patent Application No. 2010-511049 dated Jun. 25, 2013 (w/ translation).

Dec. 13, 2013 Notification of Reason for Rejection issued in Japanese Patent Application No. 2010-511049 (with translation).

* cited by examiner

ARTICLE CARRIER ROBOT

TECHNICAL FIELD

The present invention relates to an article carrier robot adapted for holding, carrying and transferring an article or articles, such as a semiconductor wafer or the like, to a target position.

BACKGROUND ART

In usual equipment for manufacturing the semiconductor wafers, the carrier robot is provided, in a clean room, for taking out and holding each semiconductor wafer from a base station and then carrying and transferring the semiconductor wafer to a target station for a next production step. FIG. 8 schematically shows general construction of such a semiconductor-wafer carrier robot.

As shown in FIG. 8, the semiconductor-wafer carrier robot 100 includes a horizontal base 101, a vertical post 102 supported by the horizontal base 101, such that this post 102 can be moved in the horizontal direction along the horizontal base 101, a robot main body 103 supported by the vertical post 102, such that this robot main body 103 can be moved in the vertical direction along the vertical post 102, and a wiring/piping bundle 104 provided, along the horizontal base 101 up to the vertical post 102, for actuating and controlling the robot main body 103 and related mechanisms thereof.

More specifically, the robot main body 103 includes a robot base 103a supported by the vertical post 102, such that this robot base 103a can be moved in the vertical direction along the vertical post 102, a plurality of robot arms (e.g., in this case, two robot arms) 103b, 103c (wherein a proximal end of the arm 103b is connected via an axis with a distal end of the robot base 103a, while a distal end of the arm 103b is connected via another axis with a proximal end of the arm 103c), and a robot hand 103d connected via still another axis with a distal end of the robot arm 103c. In this case, each of the robot arms 103b, 103c and robot hand 103d can be rotated in the horizontal direction about each corresponding axis.

With this configuration, in which the vertical post 102 is supported by the horizontal base 101, such that this post 102 can be moved in the horizontal direction along the horizontal base 101, in which the robot base 103a is supported by the vertical post 102 such that this robot base 103a can be moved in the vertical direction along the vertical post 102, and in which the robot arms 103b, 103c and robot hand 103d are connected with one another such that each of the arms and hand 103b, 103c, 103d can be rotated in the horizontal direction relative to the robot base 103a, each semiconductor wafer (not shown) held by the distal robot hand 103d can be carried and transferred to the target position, while being moved three-dimensionally.

The wiring/piping bundle 104 for actuating and controlling the robot main body 103 and related mechanisms thereof includes power-supply cables, compressed-air pipes and/or vacuum pipes, control signal lines respectively connected with sensors, and the like. In particular, such power-supply cables are respectively connected with drive mechanisms (not shown), each adapted for driving a motor or the like means provided for horizontally moving the vertical post 102, vertically moving the robot base 103a, or horizontally rotating each of the robot arms 103b, 103c and robot hand 103d.

This wiring/piping bundle 104 is inserted through a base-side protective pipe 105 formed of a rigid pipe and horizontally fixed onto the horizontal base 101, and further introduced into the vertical post 102 via a side thereof through a flexible cable bear (registered trademark) 106. In this case, each cable, pipe or line included in the bundle 104 is introduced into the vertical post 102, and then distributed and connected to each corresponding drive mechanism. In FIG. 8, for convenience, the cable bear 106 is illustrated by imaginary lines. For instance, such a cable bear 106 is reported in JP2003-37153A.

In the case of the robot 100 constructed as shown in FIG. 8, during the horizontal movement of the vertical post 102 along the horizontal base 101, the wiring/piping bundle 104 will be moved following the movement of the vertical post 102 over the horizontal base 101, while being inserted and supported through the cable bear 106 and turned around by 180°.

In such a sharply curved portion, rather great stress is exerted on the wiring/piping bundle 104, leading to generation of unwanted dust also called particles due to wear and tear of the wiring/piping bundle 104 and/or friction between the bundle 104 and the cable bear 106. In order to avoid the generation of such dust or particles, it is necessary to considerably enlarge the radius of curvature of the curved portion. Thus, when the post 102 is located in a waiting position (as depicted by a solid line in FIG. 8), a projection amount D in the horizontal direction of the curved portion is rather increased, making it difficult to achieve a more compact form of this robot.

For instance, in the carrier robot shown in FIG. 8, the maximum movable range of the vertical post 102 between the waiting position thereof depicted by the solid line and a maximum transfer position thereof depicted by a two-dot chain line is expressed by a distance L. In this case, as described above, the wiring/piping bundle 104 is moved, while being turned around by 180°. Thus, as illustrated in the drawing, the movable range Lm of the curved portion (i.e., a horizontal distance between a proximal point of the curved portion when the post 102 is in the waiting position thereof and the proximal point of the curved portion when the post 102 is in the maximum transfer position thereof) is approximately equal to ½ L (i.e., Lm=½ L). Accordingly, the length of the curved portion including such a wide movable range Lm thereof that should be supported by the cable bear 106 has to be considerably elongated. Therefore, such configuration of the carrier robot, as illustrated and described above, may tend to cause generation of so much dust or the like.

Further, since the wiring/piping bundle 104 is sharply curved at the curved portion thereof, parts of the cable bear 106 itself are also likely to be in frictional contact relative to one another. This may also tend to generate the dust or the like. Especially, in the equipment for manufacturing the semiconductors, the generation of such dust may have serious impact on the quality of each product. Therefore, in some measure, an additional means for covering the cable bear 106, such as by using a separate cover, is provided, thus further enlarging the size of such equipment.

DISCLOSURE OF THE INVENTION

Therefore, it is an object of the present invention to provide a new article carrier robot which is suitable for carrying an article, such as the semiconductor wafer or the like, and which can achieve a more compact form of the entire robot system, as well as can substantially reduce the stress exerted on each wiring and/or piping.

In order to achieve the above object, the article carrier robot according to the present invention includes: a horizontal base; a horizontally movable unit supported by the horizontal base so as to be movable in a horizontal direction; a robot main body supported by the horizontally movable unit; at least one of wiring and piping introduced into the robot main body from the horizontal base; and a restriction unit supported by the horizontally movable unit so as to be swayable about a pivot provided to the horizontally movable unit, the restriction unit being configured to restrict deformation of a part of the at least one of wiring and piping.

Preferably, the horizontally movable unit includes a vertical post, wherein the robot main body is supported by the vertical post so as to be vertically movable, and wherein the restriction unit includes a post-side protective pipe supported by the vertical post so as to be swayable about the pivot located at an upper end portion of the vertical post.

Preferably, the article carrier robot further includes a base-side protective pipe fixed to the horizontal base, wherein the at least one of wiring and piping is introduced into the vertical post through the base-side protective pipe, the post-side protective pipe and the pivot.

Preferably, in the article carrier robot, a flexible tube, through which the at least one of wiring and piping is inserted, is connected between the base-side protective pipe and the post-side protective pipe.

Preferably, in the article carrier robot, a lubricating agent is applied to an inside of the flexible tube.

Preferably, the pivot includes a cylindrical member provided through a wiring/piping introduction port formed in a side of the horizontally movable unit with an axis of the cylindrical member oriented in a substantially horizontal direction, a radial bearing externally fitted around the cylindrical member, and a support ring member externally fitted around an outer ring of the radial bearing, wherein the restriction unit is firmly supported by the support ring member.

Preferably, in the article carrier robot, a seal member for preventing discharge of particles is provided to a connection portion between the horizontally movable unit and the restriction unit.

Preferably, in the article carrier robot, an article to be carried by the carrier robot is a semiconductor wafer.

The article carrier robot according to this invention preferably includes: a horizontal base; a vertical post supported by the horizontal base so as to be movable in a horizontal direction; a robot main body, which includes one or more hands, each adapted for grasping or holding the article, and is supported by the vertical post so as to be vertically movable; and at least one of wiring and piping required for driving the robot main body and related mechanisms thereof, wherein the at least one of wiring and piping is introduced into the vertical post through a base-side protective pipe formed of rigid material and fixed to the horizontal base, and through a post-side protective pipe formed of rigid material and supported by the vertical post so as to be swayable about a pivot provided to the upper end portion of the vertical post, and further through the pivot.

Preferably, in the article carrier robot, a flexible tube, through which the at least one of wiring and piping is inserted, is connected between the base-side protective pipe and the post-side protective pipe.

Preferably, in the article carrier robot, a lubricating agent is coated on the inner wall of the flexible tube.

Preferably, the pivot includes a cylindrical member provided through a wiring/piping introduction port formed in the side of the vertical post, with the axis of the cylindrical member oriented in the substantially horizontal direction, a radial bearing externally fitted around the cylindrical member, and a support ring member externally fitted around the outer ring of the radial bearing, wherein the post-side protective pipe is firmly supported by the support ring member.

Preferably, the article carrier robot carries a semiconductor wafer.

Preferably, in the article carrier robot, a seal member for preventing unwanted discharge of particles is provided between the vertical post and a support portion of the wiring/piping introduction port.

EFFECT OF THE INVENTION

According to the article carrier robot of the present invention, the restriction unit can be swayed about the pivot, while following the horizontal movement of the horizontally movable unit along the horizontal base. Therefore, there is no need for setting the bending angle of the at least one of wiring and piping so large or sharp as set in the conventional carrier robot. As such, the stress that may be otherwise imposed on the at least one of wiring and piping at the curved portion can be significantly mitigated. In addition, the wear and tear of the at least one of wiring and piping as well as the generation of the particles due to such wear and tear can be adequately suppressed. Further, the movable range of the curved portion of the at least one of wiring and piping, associated with the horizontal movement of the horizontally movable unit along the horizontal base, can be substantially reduced. This is also highly effective for lessening the generation of the particles.

Further, the restriction unit is supported by the horizontally movable unit, such that this restriction unit can be swayed about the pivot provided to the horizontally movable unit. In this case, when the horizontally movable unit is in its waiting position, the restriction unit is in a vertically standing position by the gravity (or weight thereof). As such, there is no portion of the restriction unit projecting outside from the actual working area of the robot. Therefore, this configuration can achieve a significantly compact form of the entire robot system.

Thus, the robot of the present invention can be provided in a desired compact form, as well as the stress that may be otherwise imposed on the at least one of wiring and piping can be effectively suppressed. In addition, the movable range of the curved portion (i.e., the range or space that will be required for the movement of the curved portion) can be substantially reduced. Therefore, this robot can be well applied to those that should be installed in the clean room, such as the semiconductor-wafer carrier robot.

As described above, it is preferred that the flexible tube, through which the at least one of wiring and piping is inserted, is connected between the base-side protective pipe and the post-side protective pipe. Namely, with this configuration, the curved portion of at least one of wiring and piping can be adequately protected, as well as this curved portion can be securely kept in a smoothly bent or curved condition, during the horizontal movement of the horizontally movable unit. Further, this flexible tube can effectively suppress the generation of the particles caused by the stress due to the bending of the curved portion, thereby successfully avoiding unwanted affection on the article to be carried.

In particular, since the robot of the present invention uses the simple flexible tube, rather than using such a large-sized cable bear as employed in the conventional robot, the generation of the wear and/or particles caused by the stress due to the bending of such a flexible tube can also be adequately suppressed. Besides, this configuration can well contribute to the attempt of rendering the entire robot system more compact. In addition, with the application of a suitable lubricating agent to the inside of the flexible tube, the generation of dust that may be otherwise caused by the friction between the flexible tube and the at least one of wiring and piping can be well controlled, thereby substantially eliminating bad influence due to the leakage of the particles from the interior of the flexible tube. This can be effective, in particular, for the case in which the article to be carried is the semiconductor wafer.

Further, as described above, it is preferred that the pivot includes the cylindrical member provided through the wiring/piping introduction port formed in the side of the horizontally movable unit with the axis of the cylindrical member oriented in the substantially horizontal direction, and further includes the radial bearing externally fitted around the cylindrical member, and the support ring member externally fitted around the outer ring of the radial bearing, wherein the restriction unit is firmly supported by the support ring member. Namely, with this configuration, the radial bearing can serve to sway the restriction unit smoothly and appropriately about the pivot, following the horizontal movement of the horizontally movable unit. In addition, the at least one of wiring and piping can be smoothly introduced into the horizontally movable unit from the inside of the restriction unit through the cylindrical member.

Additionally, as described above, it is preferred that the seal member is provided to the connection portion between the horizontally movable unit and the restriction unit. Namely, with this configuration, the discharge of the particles generated inside the connection portion to the outside thereof can be well avoided, thereby securely controlling undue deterioration of the cleanliness of the surrounding environment.

BEST MODE FOR CARRYING OUT THE INVENTION

Figure 1:
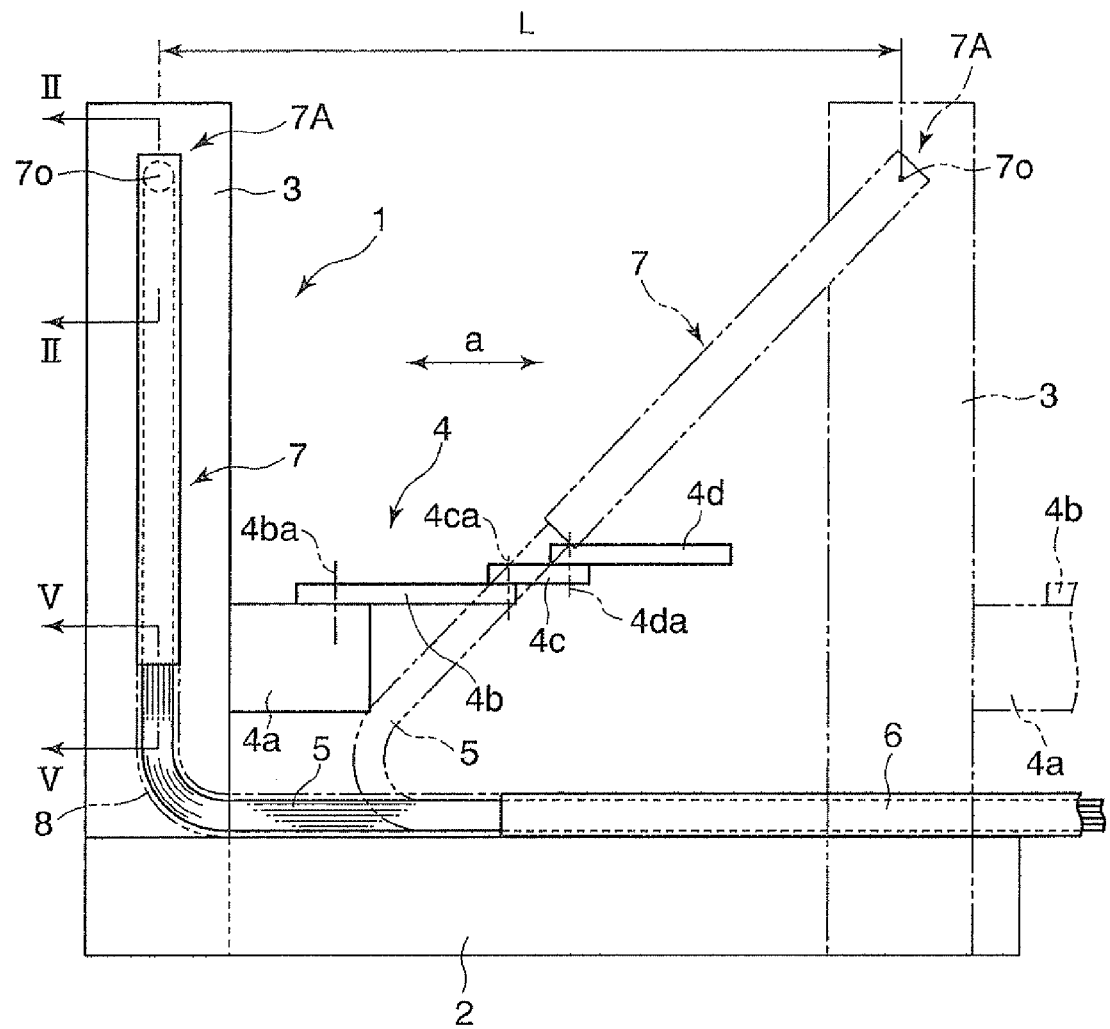
FIG. 1 is a front view schematically showing one embodiment of the article carrier robot of the present invention.

Hereinafter, one embodiment of the article carrier robot related to the present invention will be described with reference to FIGS. 1 to 7. FIG. 1 schematically shows the semiconductor-wafer carrier robot installed in a clean room. This semiconductor-wafer carrier robot 1 includes the horizontal base 2, the vertical post (or horizontally movable unit) 3 supported by the horizontal base 2 such that this vertical post 3 can be moved in the horizontal direction along the horizontal base 2, the robot main body 4 supported by the vertical post 3 such that this robot main body 4 can be moved in the vertical direction along the vertical post 3, and at least one of wiring and piping (hereinafter referred to as the "wiring/piping bundle") 5 provided along the horizontal base 2 as well as in the vertical post 3 for operating and controlling the robot main body 4 and related mechanisms.

The robot main body 4 includes the robot base 4a supported by the vertical post 3 such that this robot base 4a can be moved in the vertical direction by the vertical post 3, the plurality of robot arms (e.g., in this embodiment, two robot arms) 4b, 4c (wherein a proximal end of the arm 4b is connected with a distal end of the robot base 4a via a vertical axis 4ba, while a distal end of the arm 4b is connected with a proximal end of the arm 4c via another vertical axis 4ca), and the robot hand 4d connected with a distal end of the robot arm 4c via still another vertical axis 4da. In this case, each of the robot arms 4b, 4c can be rotated in the horizontal direction about each corresponding vertical axis 4ba, 4ca, while the robot hand 4d can be angularly displaced about the vertical axis 4da.

With this configuration, in which the vertical post 3 is supported by the horizontal base 2 such that this vertical post 3 can be moved in the horizontal direction along the horizontal base 2, in which the robot base 4a is supported by the vertical post 3 such that this robot base 4a can be moved in the vertical direction along the vertical post 3, and in which the robot arms 4b, 4c and the robot hand 4d are connected with one another such that each of the robot arms 4b, 4c and robot hand 4d can be rotated in the horizontal direction relative to the robot base 4a, the distal robot hand 4d can take out each semiconductor wafer (i.e., the article to be carried) from the base station (not shown), and then carry and transfer the semiconductor wafer to the target station (not shown), while moving the semiconductor wafer three-dimensionally.

Namely, in this embodiment, the robot main body 4 is supported by the vertical post 3 such that the main body 4 can be moved in the vertical direction along the vertical post 3, while the vertical post 3 is supported by the horizontal base 2 such that the post 3 can be moved in the horizontal direction along the horizontal base 2. Thus, a two-dimensional operation mechanism for the robot main body 4 can be set in a vertical plane. Further, the robot main body 4 in itself is composed of the plurality of robot arms (e.g., the robot arms 4b, 4c) connected with one another such that these arms can be rotated, respectively, in the horizontal direction. In addition, one or more hands 4d are supported by the robot main body 4 (or robot arm 4c) such that each hand 4d can be rotated in the horizontal direction. Accordingly, each operation for taking out each article placed on the base station, and then carrying and transferring the article to a desired target station can be performed based on a predetermined operational sequence.

For instance, the distal robot hand 4d of the robot main body 4 is formed into a fork-like shape, and operated to repeat lifting up one semiconductor wafer or container storing therein a plurality of semiconductor wafers, each placed on the base station, and then carrying and transferring such a semiconductor wafer or container onto the target station.

In the vertical post 3, a proper mechanism (e.g., a pinion mechanism composed of a rack-and-pinion mechanism or the like) for reciprocating the vertical post 3 in the horizontal direction relative to the horizontal base 2, another mechanism (e.g., a ball screw mechanism or the like) for vertically moving the robot base 4a, motors for respectively driving such mechanisms, sensors for respectively detecting the respective positions of the vertical post 3 and the robot base 4a, control units, and a suitable fluid operation mechanism composed of a compressed-air-pressure source and/or absorber, and the like, are provided respectively.

Further, in the robot base 4a, other mechanisms for respectively rotating the robot arms 4b, 4c and the robot hand 4d, motors for respectively driving such mechanisms, sensors for respectively detecting the respective positions of the robot arms 4b, 4c and the robot hand 4d, and another fluid operation mechanism composed of the compressed-air-pressure source and/or absorber, and the like, are provided respectively.

The wiring/piping bundle 5 (e.g., the bundle of wires and/or pipes 5a to 5e), which includes the power-supply cables, compressed-air pipes and/or vacuum pipes, control signal lines, for respectively operating and controlling the respective mechanisms and related components as described above, is inserted at a proximal portion thereof through the base-side protective pipe 6 formed of a suitable rigid pipe and horizontally fixed onto the horizontal base 2. Further, this wiring/piping bundle 5 is inserted at a distal portion across the curved portion thereof through the post-side protective pipe (or restriction unit) 7 composed of another rigid pipe and supported by the vertical post 3, such that this protective pipe 7 can be swayed in the vertical plane about the pivot 7A located at the upper end portion of the side wall of the vertical post 3. In this case, each cable, pipe or line (e.g., 5a to 5e) of the wiring/piping bundle 5 is further introduced into the vertical post 3 via the pivot 7A positioned at the upper end portion of the vertical post 3, and is then distributed and connected to each corresponding drive mechanism or the like.

For instance, the wires and/or pipes (not shown), respectively distributed to each drive mechanism for the robot base 4a, are further introduced into the robot base 4a from the interior of the vertical post 3. Between the base-side protective pipe 6 and the post-side protective pipe 7, the flexible tube 8 (see FIG. 5) formed from a synthetic resin or light metal into a bellows-like shape is provided, such that the curved portion of the wiring/piping bundle 5 between the two protective pipes 6, 7 can be covered with this flexible tube 8. In FIG. 1, for convenience, this flexible tube 8 is expressed by imaginary lines. Since both of the protective pipes 6, 7 are formed of the rigid pipe or pipes, the shape of the wiring/piping bundle 5 inserted through each of such pipes 6, 7 can be securely kept to be substantially straight.

Figure 2:
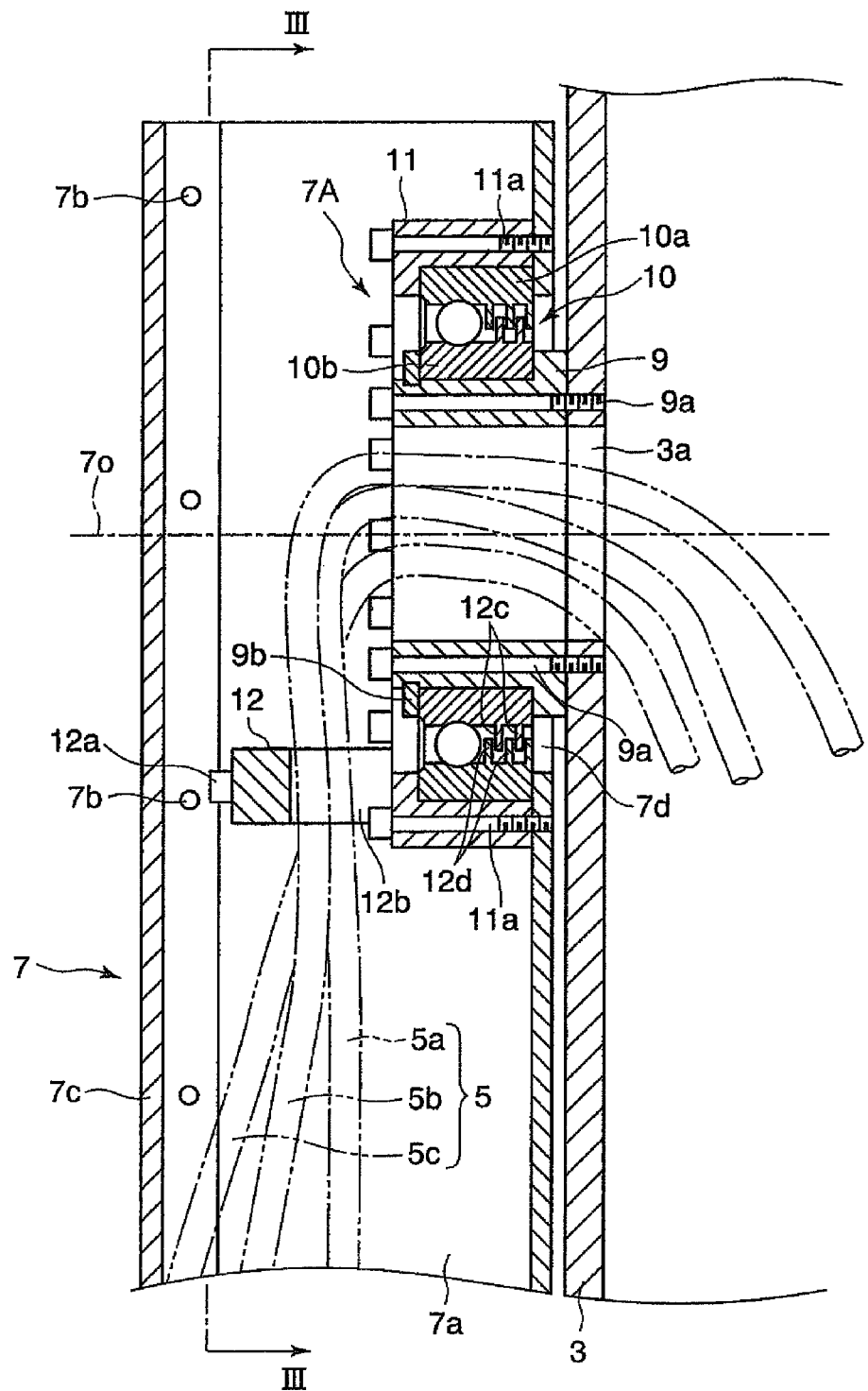
FIG. 2 is a section taken along line II-II depicted in FIG. 1.
Figure 3:
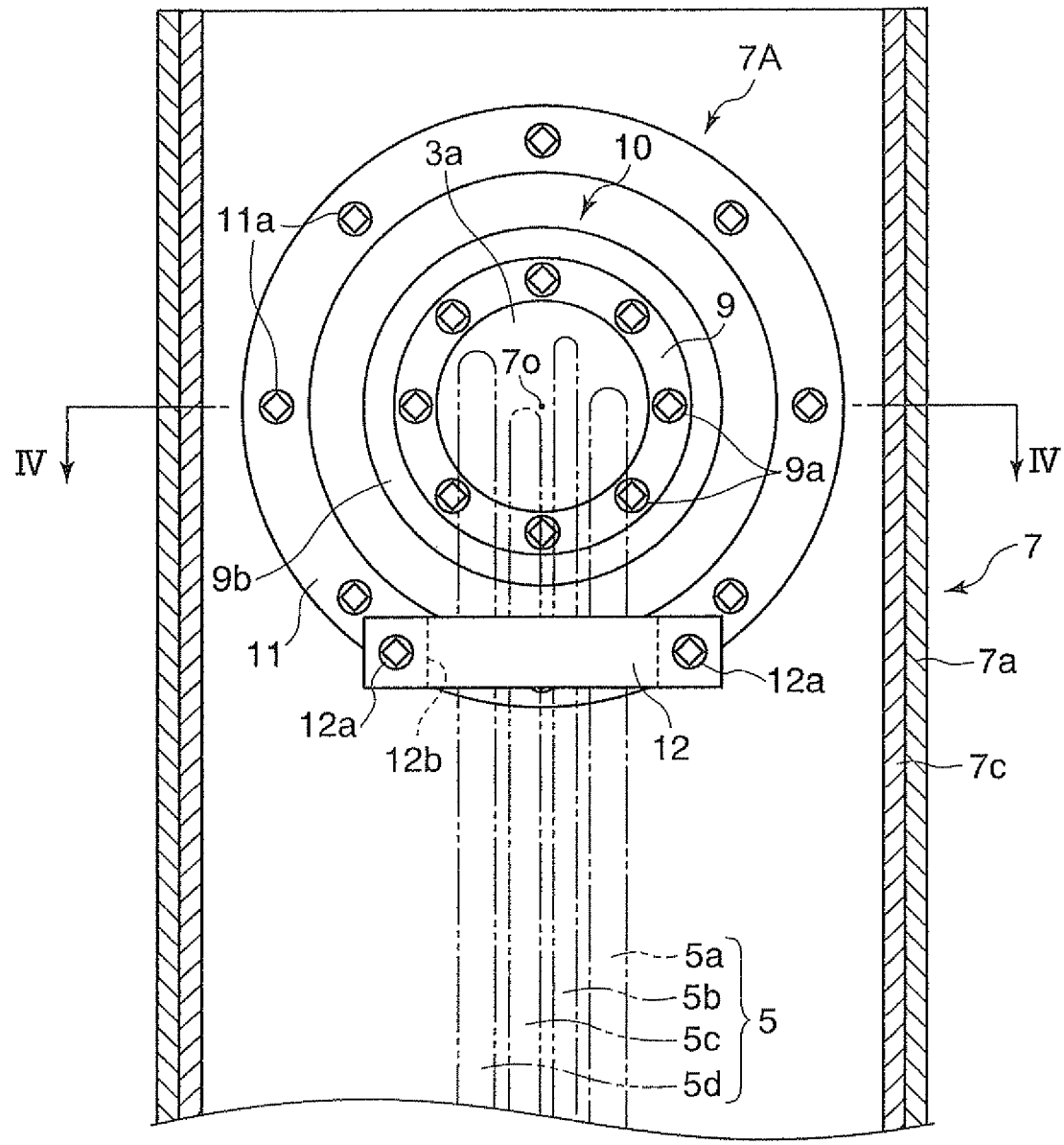
FIG. 3 is a section taken along line III-III depicted in FIG. 2.
Figure 4:
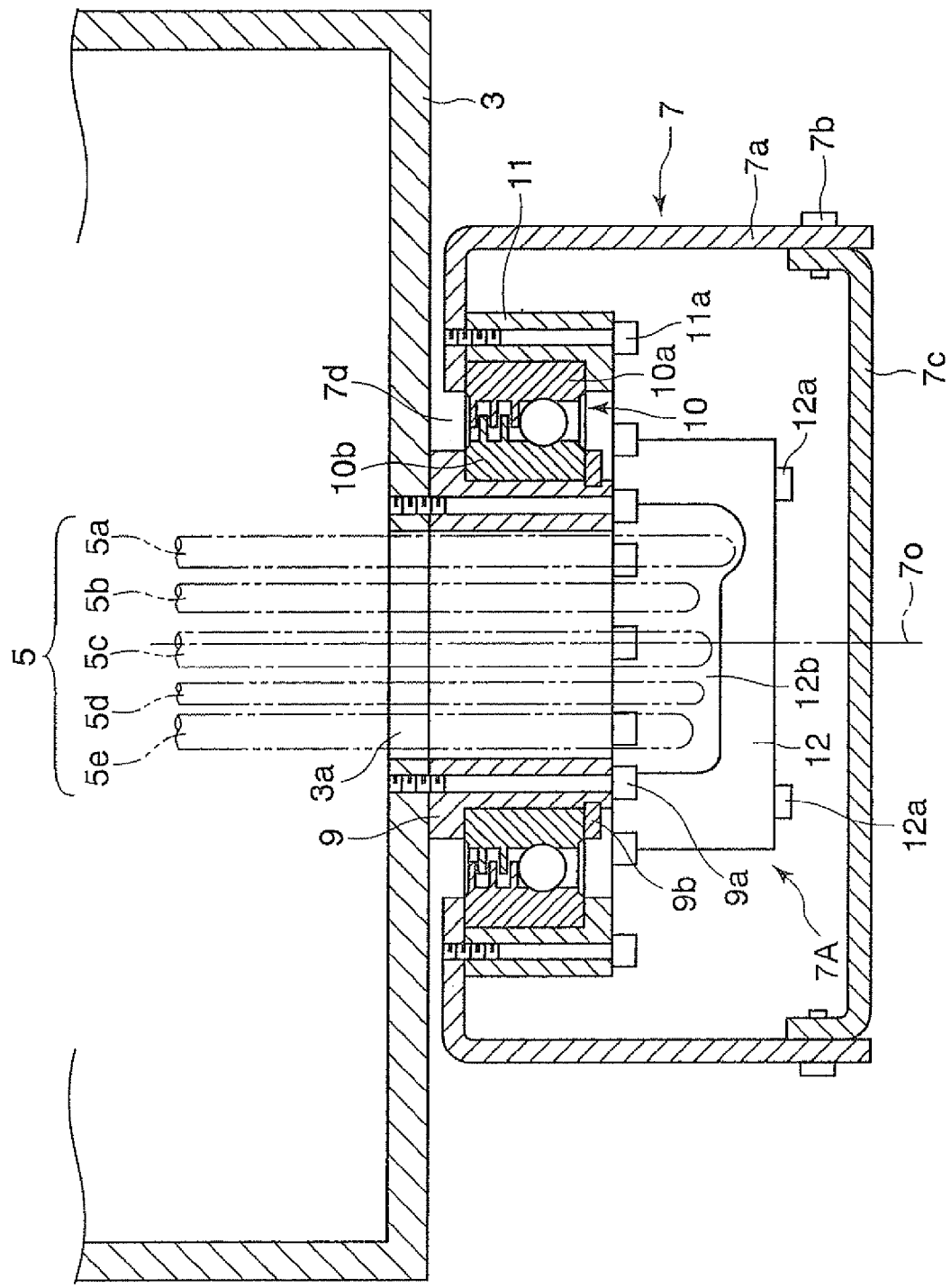
FIG. 4 is a section taken along line IV-IV depicted in FIG. 3.

FIGS. 2 to 4 are provided for respectively illustrating, in detail, one mechanism for swayably supporting the post-side protective pipe 7 about the pivot 7A relative to the vertical post 3. As shown in FIGS. 2 to 4, the pivot 7A is composed of the cylindrical member 9 having a hook-shaped section and fixed to the vertical post 3 via bolts 9a with the axis 7o of this member 9 horizontally oriented, the radial bearing (or rolling bearing) 10 externally fitted around the cylindrical member 9, and the support ring member 11 having another hook-shaped section and externally fitted around the outer ring 10a of the radial bearing 10. In this case, the post-side protective pipe 7 is firmly supported by the support ring member 11 via bolts 11a. An inner ring 10b of the radial bearing 10 is interposed between a hook edge of the cylindrical member 9 and a positioning ring 9b such that this inner ring 10b can be fixed in position relative to the cylindrical member 9.

As shown in FIG. 4, the post-side protective pipe 7 includes a tubular protective-pipe main body 7a formed of a proper rigid material, such as a steel plate or the like, and having a hollow rectangular section with one end thereof opened in one direction, and a cover 7c fixed to opening edges of the main body 7a via bolts 7b so as to cover the opening of the main body 7a. A circular hole 7d is formed in a bottom plate of the main body 7a, and the support ring member 11 is firmly attached to the post-side protective pipe 7 around the circular hole 7d thereof via the bolts 11a. Further, the outer ring 10a of the radial bearing 10 is interposed between an edge of the post-side protective pipe 7 around the circular hole 7d and a rectangular edge of the support ring member 11 such that this outer ring 10a of the bearing 10 can be integrally fixed to the post-side protective pipe 7.

With this configuration, in which the inner ring 10b of the bearing 10 can be externally fixed around the cylindrical member 9 that is in turn fixed to the vertical post 3, while the outer ring 10a of the bearing 10 can be integrally fixed to the post-side protective pipe 7, this post-side protective pipe 7 can be swayed in the vertical plane about the axis 7o thereof. In order to prevent the generation of the unwanted particles between the cylindrical member 9 and the support ring member 11, respectively fixing the inner ring 10b and the outer ring 10a of the radial bearing 10, a labyrinth seal is provided, such as by arranging ring-like partition wall members, as respectively designated by reference numerals 12c, 12d, alternately and axially, to the outer ring 10a and inner ring 10b. As used herein, the term "labyrinth seal" generally means a non-contact seal that is intended to positively control leakage of gas by utilizing pressure loss caused by bending the flow passage of the gas.

In the structure of the pivot 7A for swaying the post-side protective pipe 7 as described above, the interior of the vertical post 3 is communicated with the interior of the post-side protective pipe 7 via the cylindrical member 9 and the wiring/piping introduction port 3a of the vertical post 3. As will be described later, the wiring/piping bundle 5, once introduced into the post-side protective pipe 7 via the flexible tube 8 at a lower end of the post-side protective pipe 7, is further introduced into the vertical post 3 through the cylindrical member 9 and the wiring/piping introduction port 3a at an upper end of the post-side protective pipe 7, and then each wire and/or pipe of the bundle 5 is distributed and connected to each corresponding drive mechanism or the like.

At a lower end face of the support ring member 11 on the introduction side relative to the wiring/piping bundle 5, as shown in FIGS. 2 and 3, a U-shaped wiring/piping restriction member 12 is fixed in position by bolts 12a. Namely, the wiring/piping bundle 5 is once inserted through an opening 12b provided between the restriction member 12 and the lower end face of the support ring member 11, and then introduced into the vertical post 3. In this way, undue separation of the respective wires and/or pipes of the wiring/piping bundle 5 can be adequately controlled during the sway of the post-side protective pipe 7, thereby reducing unwanted friction between the wires and/or pipes of the wiring/piping bundle 5, as well as effectively smoothing the sway movement of the post-side protective pipe 7. Because the wiring/piping bundle 5 includes the wires and/or pipes respectively having various thicknesses, such a shape of the opening 12b formed of a notched portion of the wiring/piping restriction member 12, as shown in the drawings, is suitable for gathering the respective wires and/or pipes of the wiring/piping bundle 5 into a compact form. Further, for positively preventing occurrence of abrasion or scratches on the respective wires and/or pipes of the wiring/piping bundle 5, each edge of the wiring/piping restriction member 12 is appropriately chamfered or rounded.

Figure 5:
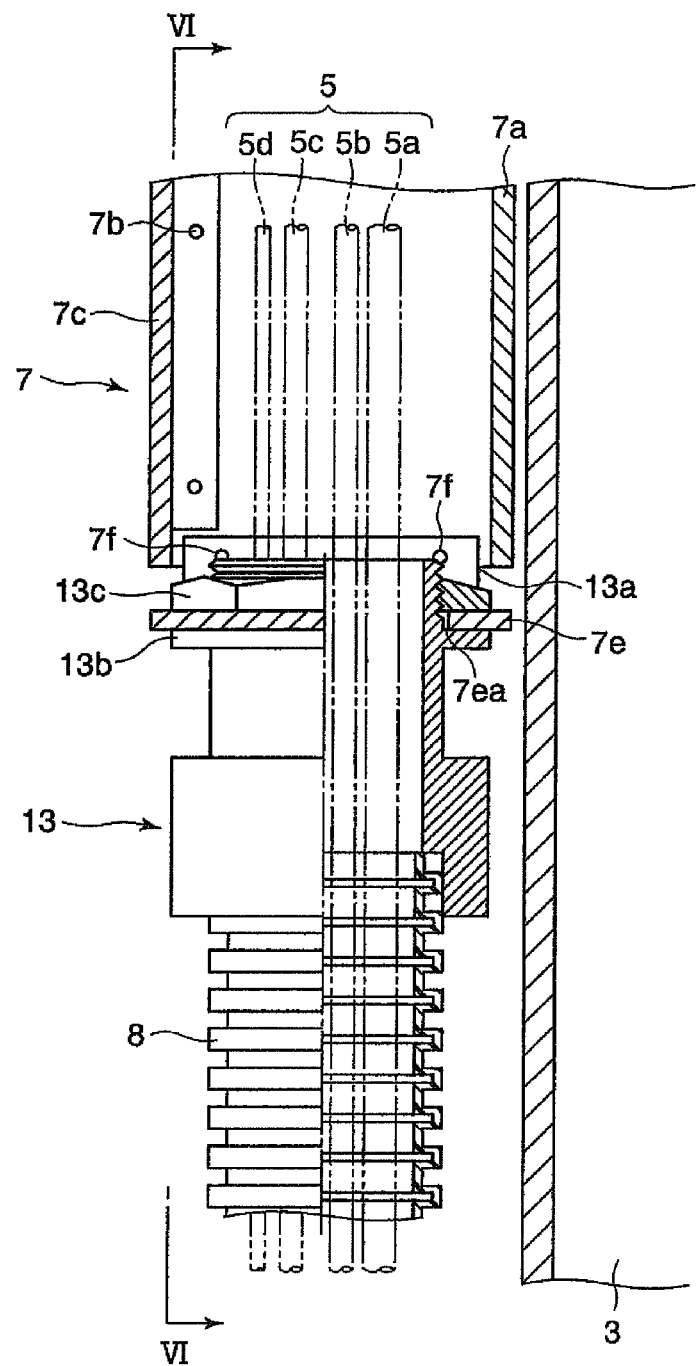
FIG. 5 is a section taken along line V-V depicted in FIG. 1.
Figure 6:
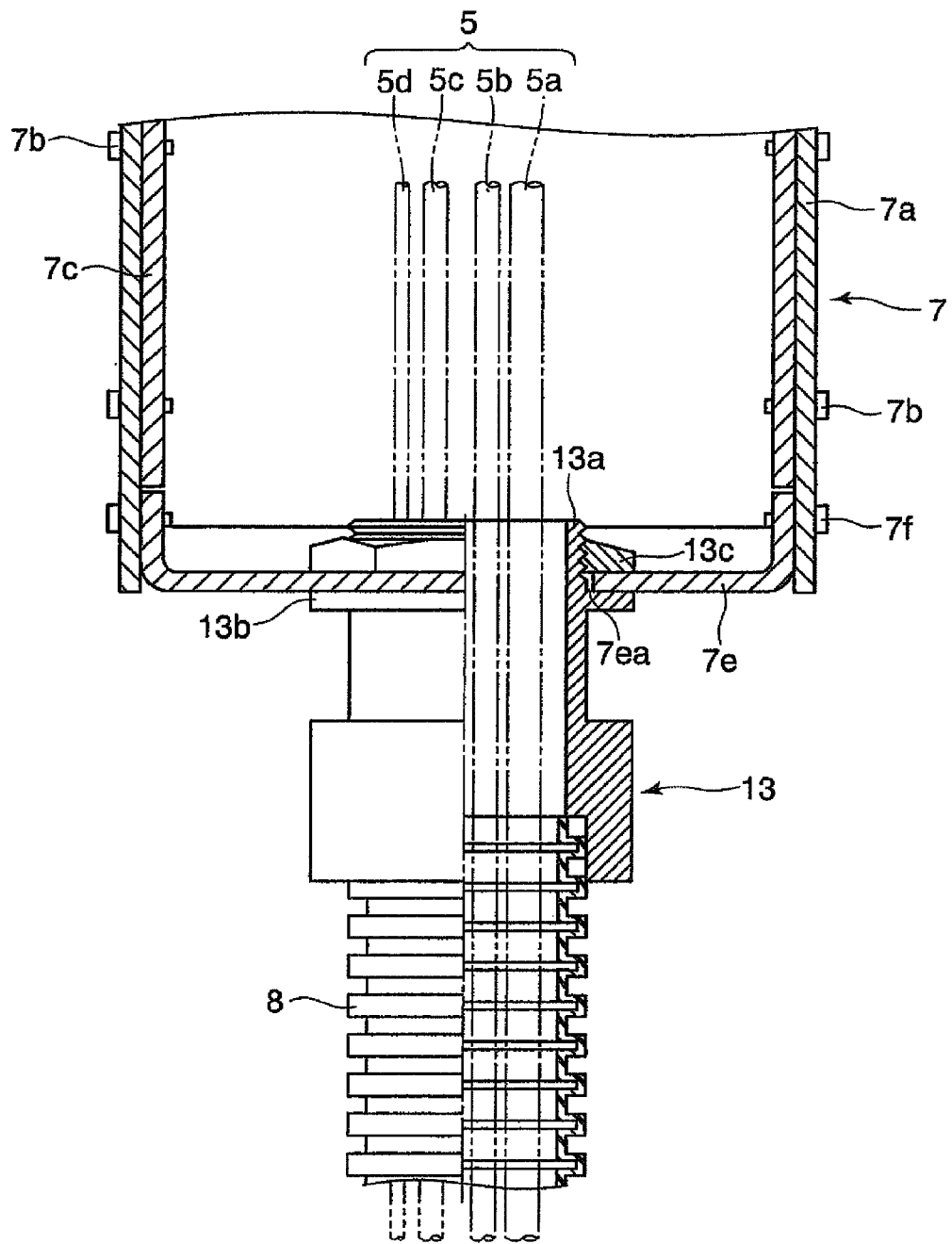
FIG. 6 is a section taken along line VI-VI depicted in FIG. 5.
Figure 7:
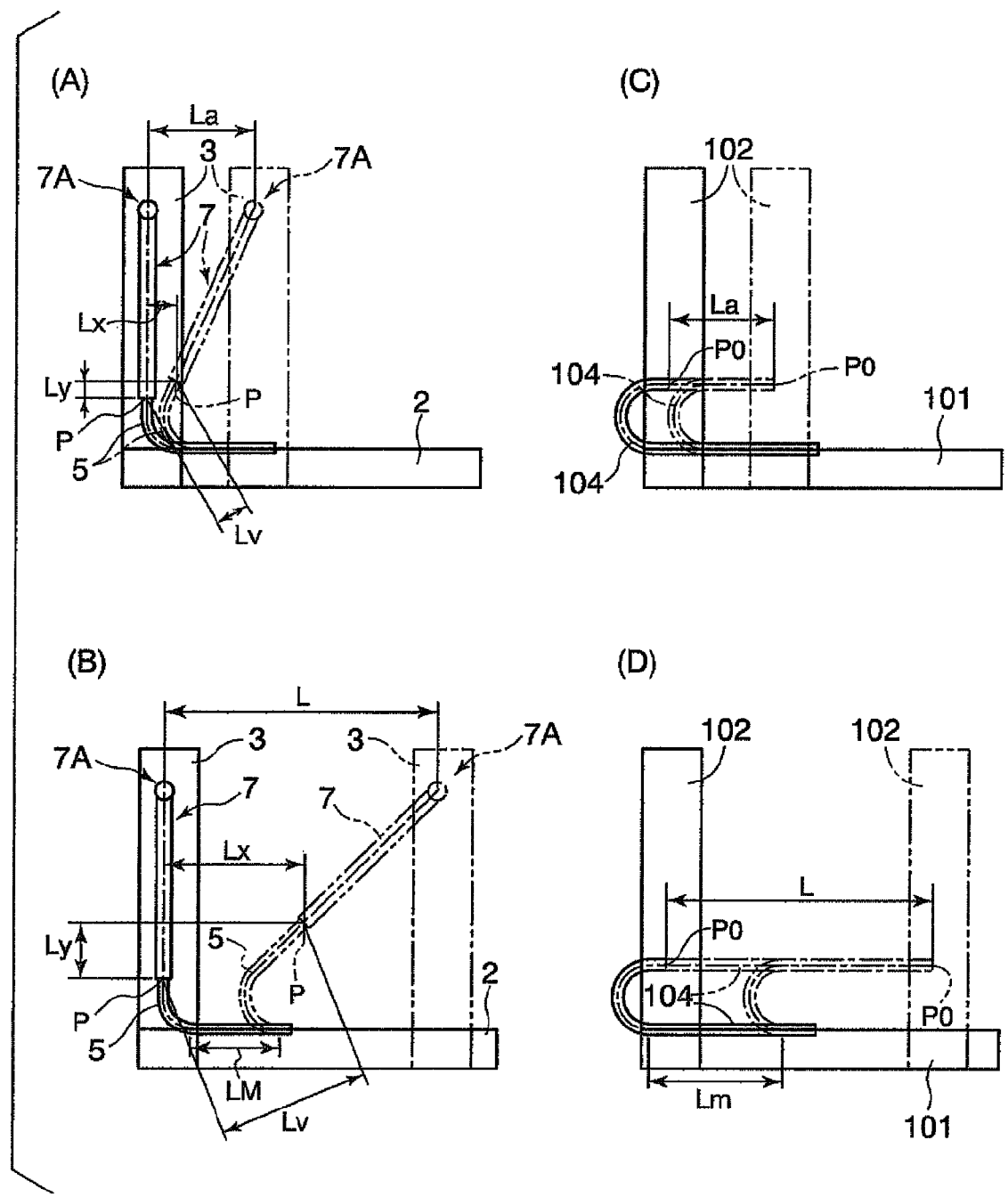
FIGS. 7(A) to 7(D) are illustrations for respectively showing a comparison of operations between the article carrier robot of the above embodiment and the conventional carrier robot, wherein FIGS. 7(A) and 7(B) respectively show the operation of the carrier robot of this invention, while FIGS. 7(C) and 7(D) respectively show the operation of the conventional carrier robot.

FIGS. 5 and 6 are provided for respectively showing details of the structure of a portion for introducing the wiring/piping bundle 5 into the lower end of the post-side protective pipe 7. At the lower end of the tubular main body 7a of the post-side protective pipe 7, a lower-end cover 7e is fixed in position by using bolts 7f. A circular hole 7ea is formed in the lower-end cover 7e, and a male screw 13a of a joint 13 fixedly connected with a distal end of the flexible tube 8 is inserted through the circular hole 7ea. A flange 13b is provided to a proximal end of the male screw 13a. Further, a nut 13c is meshed with the male screw 13a inserted through the circular hole 7ea. Thus, when the nut 13c is fastened with the male screw 13a, the lower-end cover 7e can be firmly held between the nut 13c and the proximal flange 13b of the screw 13a. In this way, the lower-end cover 7e can be connected with the flexible tube 8 via the joint 13.

Meanwhile, a proximal end of the flexible tube 8 is connected with a similar joint (not shown) fixed to a distal end of the base-side protective pipe 6. In this case, the flexible tube 8 is connected with the joint 13 by using a proper adhesive or the like. Thus, in this flexible tube 8, the wiring/piping bundle 5, which has been first introduced into the base-side protective pipe 6 and then introduced into the post-side protective pipe 7 via the flexible tube 8, can be optionally bent or curved together with the flexible tube 8.

Namely, in the article carrier robot 1 constructed as described above, the vertical post 3 can be reciprocated in the horizontal direction along the horizontal base 2, as depicted by an arrow a in FIG. 1, while being kept in a vertically standing state. In FIG. 1, a solid line designates the waiting position of the vertical post 3, while a two-dot chain line denotes the maximum transfer position of the post 3. Accordingly, the distance L between such two positions designates the maximum movable range of the vertical post 3. When the vertical post 3 is in the waiting position thereof (as depicted by the solid line), the post-side protective pipe 7 takes a substantially vertical position by the gravity (or weight thereof) along the vertical post 3. Thus, at this time, the curved portion of the wiring/piping bundle 5 is curved or bent at an angle of approximately 90°. In this curved state, as illustrated in FIG. 1, the curved portion of the wiring/piping bundle 5 is not projected outside the vertical post 3. Therefore, this robot can be provided in a significantly compact form.

During the transfer of the vertical post 3 from the waiting position to the position depicted by the two-dot chain line, the vertical post 3 is moved while pulling the wiring/piping bundle 5. In this state, the post-side protective pipe 7 will be swayed about the pivot 7A by the pulling effect of the vertical post 3, thus taking such an inclined position (depicted by the two-dot chain line) as shown in FIG. 1. As a result, the curved portion of the wiring/piping bundle 5 will be bent or curved at an angle substantially greater than 90°. However, unlike the aforementioned conventional carrier robot, this bending angle is far less than 180°.

Therefore, the stress that will be imposed on the wiring/piping bundle 5 due to this bending operation can be substantially lessened, as compared with the case of the conventional carrier robot. Accordingly, the wear and tear of the wiring/piping bundle 5 due to such lessened stress can be significantly reduced, thereby successfully controlling the generation of the dust. Preferably, a proper sliding or lubricating agent, such as grease or the like for use in the clean room, is coated on the inner wall of the flexible tube 8. With such treatment, the generation of the dust due to the friction between the wiring/piping bundle 5 and the flexible tube 8 can be effectively controlled.

In this article carrier robot 1, when the vertical post 3 is horizontally moved to the base station, the robot base 4a is vertically moved, and then each of the robot arms 4b, 4c and robot hand 4d is horizontally pivoted to take out each semiconductor wafer from the base station. Thus, the semiconductor wafer can be held on the distal robot hand 4d. Thereafter, the vertical post 3 is horizontally moved again to transfer the semiconductor wafer to the target station. Then, the robot base 4a is vertically moved, and each of the robot arms 4b, 4c and robot hand 4d is horizontally rotated so as to transfer the semiconductor wafer onto the target station. Further, such an operation will be repeated in the clean room. The range, in which each of the robot arms 4b, 4c and robot hand 4d can be rotated, varies with each particular specification provided for the robot 1. Typically, however, this range is set at approximately 270° about the axis 4ba.

Figure 8:
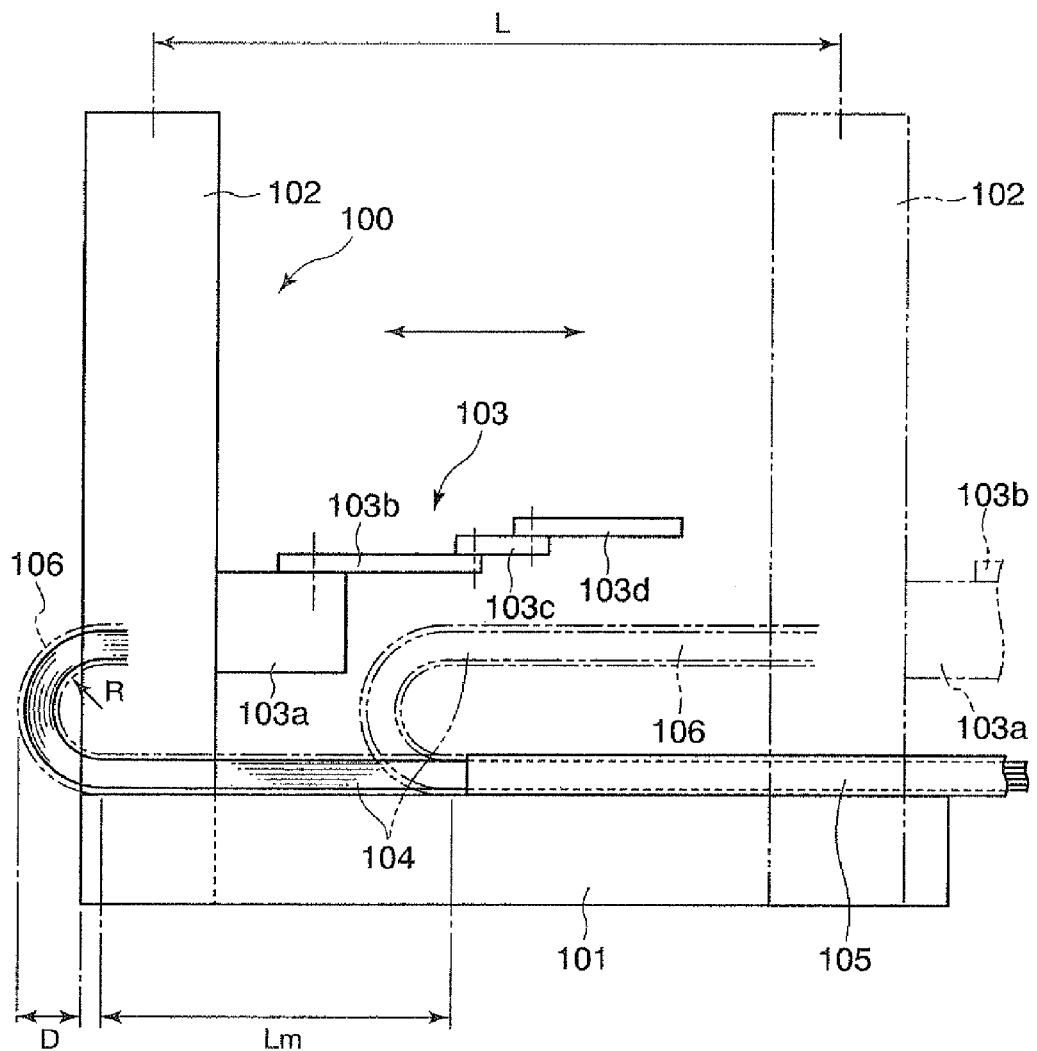
FIG. 8 is a front view schematically showing the conventional art article carrier robot.

Now, referring to FIGS. 7(A) to 7(D), the movement of the post-side protective pipe 7 will be discussed in comparison with the conventional carrier robot. FIGS. 7(A) and 7(B) respectively show the movement of the vertical post 3 in the article carrier robot 1 according to this invention, wherein the two-dot chain line of FIG. 7(A) designates a beginning state of the movement of the vertical post 3, while the two-dot chain line of FIG. 7(B) denotes a state in which the vertical post 3 has been moved over the maximum transfer distance. Meanwhile, FIGS. 7(C) and 7(D) respectively show the movement of the vertical post 102 in the conventional carrier robot shown in FIG. 8, wherein FIGS. 7(C) and 7(D) are provided, respectively corresponding to FIGS. 7(A) and 7(B).

As shown in FIG. 7(A), when the vertical post 3 is moved by a distance La, the wiring/piping bundle 5 is pulled by the vertical post 3, and the post-side protective pipe 7 is slightly swayed about the pivot 7A. At this point of time, a connection point (or distal point of the curved portion) P between the wiring/piping bundle 5 and the post-side protective pipe 7 is moved obliquely upward, as shown in FIG. 7(A), by a transfer amount Lv that is defined by a horizontal component Lx and a vertical component Ly of the movement. As apparently seen from the drawing, the transfer amount Lv is far less than the transfer distance La of the vertical post 3. Further, as shown in the drawing, since the connection point P is moved obliquely upward by the transfer amount Lv, the bending angle of the curved portion of the wiring/piping bundle 5 will be gradually increased greater than 90° as the vertical post 3 is moved toward the maximum transfer position thereof.

Thereafter, as shown in FIG. 7(B), once the vertical post 3 has been moved over the maximum transfer distance L, the obliquely upward transfer amount Lv of the connection point P defined by the horizontal component Lx and vertical component Ly will also be the maximum. Again, as apparently seen from the same drawing, this transfer amount Lv is far less than the maximum transfer distance L of the vertical post 3. Therefore, the movable range LM of the wiring/piping bundle 5 (i.e., the horizontal distance between a proximal point of the curved portion when the vertical post 3 is in the waiting position thereof and the proximal point of the curved portion when the post 3 is in the maximum transfer position thereof) can be reduced less than ½ L (i.e., LM<½ L). Meanwhile, the sway angle of the post-side protective pipe 7 is increased up to the maximum thereof as the vertical post 3 is moved toward the maximum transfer position thereof. In this case, as shown FIG. 7(B), the bending angle of the curved portion of the wiring/piping bundle 5 will also be increased greater than the angle shown in FIG. 7(A) as the sway angle of the post-side protective pipe 7 is increased. However, the maximum bending angle of this curved portion is substantially less than 180°. Thus, as compared with the conventional robot, the range or space required for the movement of the curved portion of the wiring/piping bundle 5 including the aforementioned movable range LM can be substantially reduced. This can securely render the entire robot system more compact, as well as can effectively reduce the generation of the dust or the like.

Meanwhile, in the case of the conventional robot, as shown in FIG. 7(C), when the vertical post 102 is moved by the distance La, the connection point (i.e., a distal end point of the curved portion) P0 between the wiring/piping bundle 104 and the vertical post 102 will also be moved by the distance La. In this case, the vertical post 102 is moved in the horizontal direction, while the bending angle of the curved portion is kept at the initial angle of 180°. Thereafter, as shown in FIG. 7(D), once the vertical post 102 has been moved over the maximum transfer distance, the transfer amount of the connection point (i.e., the distal end point of the curved portion) P0 will also be the maximum. Of course, this transfer amount can be considered to be equal to the maximum transfer distance of the vertical post 102. Besides, as described above, since the vertical post 102 is moved with the bending angle of the curved portion kept at 180°, the movable range Lm of the curved portion of the wiring/piping bundle 104 (i.e., the horizontal distance between the proximal point of the curved portion when the post 102 is in the waiting position thereof and the proximal point of the curved portion when the post 102 is in the maximum transfer position thereof) is approximately equal to ½ L (i.e., Lm=½ L). Thus, for such a conventional robot, it is necessary to ensure a considerably wide range or space required for the movement of the curved portion of the wiring/piping bundle 104 including the movable range Lm. Accordingly, this conventional robot should be so large-sized, leading to undue increase of the generation of the dust or the like.

Thus, in this conventional robot, the wiring/piping bundle 104 is moved with the bending angle of the curved portion kept at 180° during the repetition of the horizontal reciprocation of the vertical post 102. Therefore, the stress due to the friction or the like between related components and/or parts is always generated, thus being likely to cause the wear and/or tear of the wiring/piping bundle 104 as well as the associated dust generation. Meanwhile, in this invention, the operation that the bending angle is gradually increased from 90° and then gradually decreased to 90° is repeated during the repetition of the horizontal reciprocation of the vertical post 3. However, this bending angle is never increased up to such a large angle of 180° or so. Besides, the stress that will be exerted on the related components or the like can be partly absorbed or cancelled by the sway movement of the post-side protective pipe 7. Therefore, the wear and/or tear of the wiring/piping bundle 5 as well as the associated dust generation can be adequately reduced. In addition, even if the dust is generated to some extent around the curved portion of the wiring/piping bundle 5, the leakage of such dust can be securely prevented by the flexible tube 8 that covers the curved portion of the wiring/piping bundle 5. Thus, the provision of such a flexible tube 8 can substantially eliminate any influence due to the dust that would be otherwise exerted on each transferred semiconductor wafer.

While the above embodiment has been shown and described in regard to the semiconductor-wafer carrier robot, this invention can also be applied to any suitable carrier robot for carrying other electronic and/or high-precision parts or components, and the like. Especially, this invention is suitable for the robot for carrying such parts or components in the clean room. As the mechanism for horizontally moving the vertical post 3, vertically moving the robot main body 4, or connecting the robot arms 4b, 4c and robot hand 4d such that each of the arms and hand can be rotated in the horizontal direction, any suitable mechanism currently employed in various similar robots that have been known so far can be used. Further, while one example that employs the radial bearing 10 as the mechanism for swaying the post-side protective pipe 7 has been described above, any other suitable bearing and/or swaying mechanism can also be used.

While the above embodiment has been discussed in regard to the robot main body 4 including only one robot hand 4d, a plurality of robot hands may be provided to the distal robot arm 4c in another embodiment according to this invention. In either case, the same or substantially similar effect can be obtained.

It is noted that the wiring/piping bundle 5 may be moved to some extent in the post-side protective pipe (or restriction unit) 7. Further, the post-side protective pipe (or restriction unit) 7 is not necessarily formed of the rigid pipe. Namely, this post-side protective pipe 7 may be endowed with some flexibility, provided that this pipe 7 can adequately restrict undue deformation of the wiring/piping bundle 5. Further, the post-side protective pipe 7 in the above embodiment is not necessarily provided as a straight pipe. For instance, this protective pipe 7 may have a curved shape well fitted for the bending direction of the wiring/piping bundle 5. In short, the restriction unit (i.e., the post-side protective pipe) 7 may have any suitable shape, provided that this unit or pipe 7 can adequately restrict unwanted deformation of the wiring/piping bundle 5, while being supported by the horizontally movable member (i.e., the vertical post) 3, such that this unit or pipe 7 can be swayed about the pivot 7A.

While one preferred embodiment of the present invention has been shown and described, it should be construed that various modifications can be appropriately made thereto without departing from the scope of this invention.

The invention claimed is:

1. An article carrier robot, comprising:
   a horizontal base;
   a horizontally movable unit that is supported by the horizontal base so as to be movable in a horizontal direction and that includes a vertical post;
   a robot main body that is supported by the vertical post of the horizontally movable unit so as to be vertically moveable;
   at least one of wiring and piping connected to the robot main body from the horizontal base; and
   a restriction unit (1) that is supported by the horizontally movable unit so as to be swayable about a pivot on the vertical post of the horizontally movable unit, (2) that includes a post-side protective pipe supported by the vertical post so as to be swayable about the pivot, and (3) that is configured to restrict deformation of a part of the at least one of wiring and piping.

2. The article carrier robot according to claim 1, wherein the pivot is located at an upper end portion of the vertical post.

3. The article carrier robot according to claim 2, further comprising:
   a base-side protective pipe fixed to the horizontal base,
   wherein the at least one of wiring and piping is connected to the vertical post through the base-side protective pipe, the post-side protective pipe and the pivot.

4. The article carrier robot according to claim 3, wherein a flexible tube, through which the at least one of wiring and piping is disposed within, is connected to the base-side protective pipe and the post-side protective pipe.

5. The article carrier robot according to claim 4, further including a lubricating agent on an inside of the flexible tube.

6. The article carrier robot according to claim 5, wherein the pivot comprises a cylindrical member provided through a wiring/piping introduction port formed in a side of the horizontally movable unit with an axis of the cylindrical member oriented in a substantially horizontal direction, a radial bearing externally fitted around the cylindrical member, and a support ring member externally fitted around an outer ring of the radial bearing, and wherein the restriction unit is firmly supported by the support ring member.

7. The article carrier robot according to claim 5, wherein the carrier robot is configured to carry a semiconductor wafer.

8. The article carrier robot according to claim 4,
wherein the pivot comprises a cylindrical member provided through a wiring/piping introduction port formed in a side of the horizontally movable unit with an axis of the cylindrical member oriented in a substantially horizontal direction, a radial bearing externally fitted around the cylindrical member, and a support ring member externally fitted around an outer ring of the radial bearing, and
wherein the restriction unit is firmly supported by the support ring member.

9. The article carrier robot according to claim 4, wherein the carrier robot is configured to carry a semiconductor wafer.

10. The article carrier robot according to claim 3,
wherein the pivot comprises a cylindrical member provided through a wiring/piping introduction port formed in a side of the horizontally movable unit with an axis of the cylindrical member oriented in a substantially horizontal direction, a radial bearing externally fitted around the cylindrical member, and a support ring member externally fitted around an outer ring of the radial bearing, and
wherein the restriction unit is firmly supported by the support ring member.

11. The article carrier robot according to claim 3, wherein the carrier robot is configured to carry a semiconductor wafer.

12. The article carrier robot according to claim 2,
wherein the pivot comprises a cylindrical member provided through a wiring/piping introduction port formed in a side of the horizontally movable unit with an axis of the cylindrical member oriented in a substantially horizontal direction, a radial bearing externally fitted around the cylindrical member, and a support ring member externally fitted around an outer ring of the radial bearing, and
wherein the restriction unit is firmly supported by the support ring member.

13. The article carrier robot according to claim 2, wherein the carrier robot is configured to carry a semiconductor wafer.

14. The article carrier robot according to claim 1,
wherein the pivot comprises a cylindrical member provided through a wiring/piping introduction port formed in a side of the horizontally movable unit with an axis of the cylindrical member oriented in a substantially horizontal direction, a radial bearing externally fitted around the cylindrical member, and a support ring member externally fitted around an outer ring of the radial bearing, and
wherein the restriction unit is firmly supported by the support ring member.

15. The article carrier robot according to claim 14, wherein a seal member for preventing discharge of particles is on a connection portion between the horizontally movable unit and the restriction unit.

16. The article carrier robot according to claim 15, wherein the carrier robot is configured to carry a semiconductor wafer.

17. The article carrier robot according to claim 14, wherein the carrier robot is configured to carry a semiconductor wafer.

18. The article carrier robot according to claim 1, wherein the carrier robot is configured to carry a semiconductor wafer.

* * * * *